United States Patent [19]

Loro

[11] 3,739,236

[45] June 12, 1973

[54] SEMICONDUCTOR SWITCHING DEVICE

[75] Inventor: Alberto Loro, Ottawa, Ontario, Canada

[73] Assignee: Microsystems International Limited, Montreal, Quebec, Canada

[22] Filed: July 19, 1971

[21] Appl. No.: 163,821

[30] Foreign Application Priority Data

Feb. 23, 1971 Great Britain ..................... 5,257/71

[52] U.S. Cl. ........................ 317/235 R, 317/235 AB

[51] Int. Cl. ............................................ H01l 11/00

[58] Field of Search ..................................... 317/235

[56] References Cited

UNITED STATES PATENTS

| | | | |
|---|---|---|---|
| 3,337,782 | 8/1967 | Todaro | 317/235 |
| 3,486,088 | 12/1969 | Gray et al. | 317/235 |
| 3,566,210 | 2/1971 | De Cecco | 317/235 |
| 3,504,241 | 3/1970 | Dumanevich | 317/235 |
| 3,577,046 | 5/1971 | Moyson | 317/235 |
| 3,372,318 | 3/1968 | Tefft | 317/235 |
| 3,566,211 | 2/1971 | Svedberg | 317/235 |

*Primary Examiner*—John W. Huckert
*Assistant Examiner*—E. Wojciechowicz
*Attorney*—Edward E. Pascal

[57] ABSTRACT

A four layer two terminal semiconductor switch having a preferred lowest resistance current path from its base contact through the base adjacent the emitter. Means are provided to cause a particular position or region of the base periphery to break down at the switching current, or to cause base current to flow to a conductive ring at the surface of the base; whereby an emitter-biasing voltage is set up in the base. Good individual control of both the switching current ($I_S$) and the holding current ($I_H$) is thus afforded.

22 Claims, 21 Drawing Figures

Patented June 12, 1973 3,739,236

4 Sheets-Sheet 1

INVENTOR
ALBERTO LORO

BY E. E. Sassal

PATENT AGENT

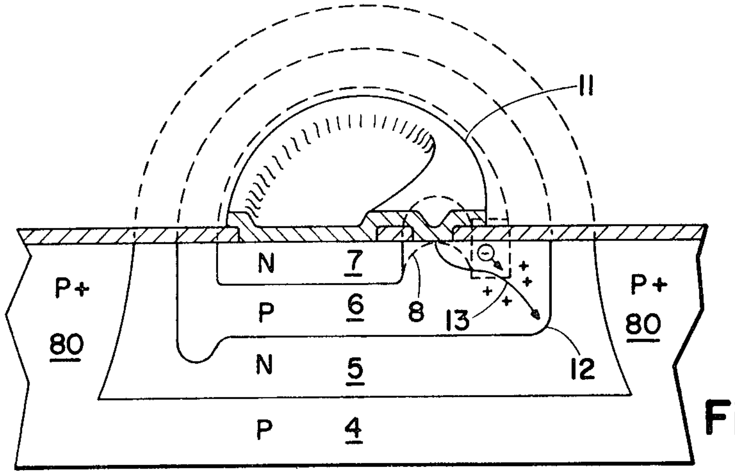
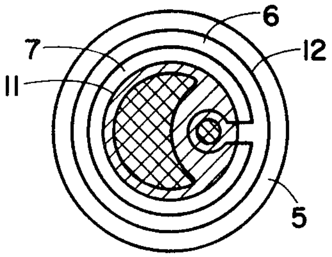
Fig. 4A
Fig. 4
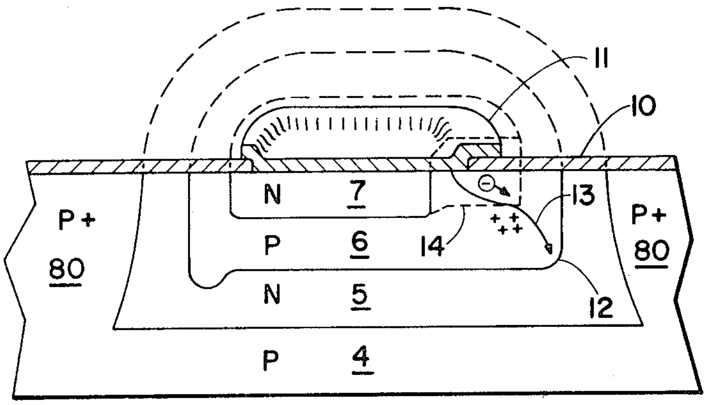
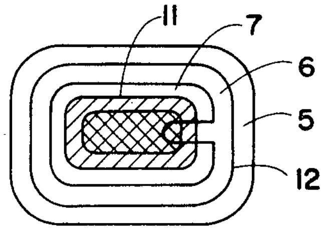
Fig. 5A
Fig. 5
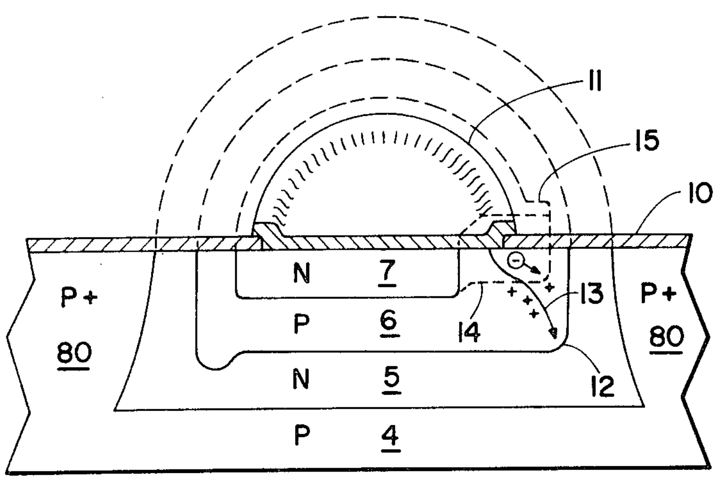
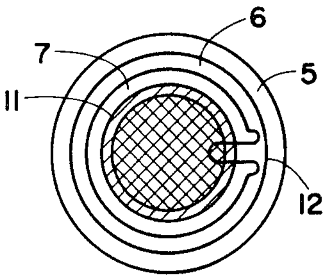
Fig. 6A
Fig. 6
INVENTOR
ALBERTO LORO
BY E. E. Sarsal

INVENTOR
ALBERTO LORO

BY E. E. Pascal

PATENT AGENT

INVENTOR
ALBERTO LORO

BY E. E. Pascal
PATENT AGENT

SEMICONDUCTOR SWITCHING DEVICE

This invention relates to the structure of a semiconductor switching device which exhibits low impedance characteristics when switched on, and high impedance characteristics when switched off. The structure is particularly useful in a four layer PNPN switch.

A well-known form of semiconductor switch is a four layer semiconductor device having contiguous regions of alternating N and P doped extrinsic regions. In general, this type of device has taken two forms: the two terminal device, and the three terminal device, the latter in which the third terminal is used as a gate for turning the device on or off. The former type of device is normally switched on or off by increasing the bias voltage applied, to a level at which the internal impedance suddenly changes to a relatively low value. With a bias voltage maintaining current, a bidirectional signal may be conducted through the semiconductor.

One application for such a switch is as a crosspoint in an array of electrical mutually orthogonal conductors, the conductors being connected by semiconductor switches where they intersect. A bias voltage applied across two orthogonal conductors results in the voltage being applied across one semiconductor switch, and when the voltage is at a critical level, the semiconductor switch will change to a low impedance state, allowing a bidirectional signal to pass from one conductor to the other.

This invention is directed to the two terminal semiconductor switch.

In order that the semiconductor switch should have utility in a large array, or in a sequence of cascaded arrays, and be capable of passing wideband signals with reliability, certain characteristics are desirable.

The semiconductor switch should have low capacitance between its two terminals, preferably less than 6 picofarads, for example. A large capacitance results in reduced impedance at higher frequencies, which can result in cross-talk between parallel conductors in an array. A large capacitance can also increase the rate firing probability, which results from differentiation of the leading or trailing edges of low voltage signal (or noise) pulses appearing at the semiconductor switch terminals.

It is also desirable that a semiconductor switch have a relatively high turn-on switching current level, a low holding current level, if possible, and a linear transfer characteristic when on. High turn-on switching current will decrease the rate-firing probability, reducing the tendency of the device to be switched on by random noise pulses.

Low holding current will reduce power supply requirements and a linear characteristic will keep translation distortion to a minimum.

The theory of operation of semiconductor switches, particularly four layer PNPN switches is well documented. The reader is referred to the Journal of Applied Physics, Vol. 30, No. 11, Nov. 1959, pages 1,819 to 1,824, in an article by Aldrich and Holonyak, Jr.; U.S. Pat. No. 3,337,783, issued Aug. 22, 1967 to Stehney; and U.S. Pat. No. 3,372,318, issued Mar. 5, 1968 to E.G. Tefft.

A description of the prior art, and of this invention in detail will be given with reference to the following drawings in which:

FIG. 4 is a view similar to FIG. 3 of a second embodiment of the invention, FIG. 4A showing a plan view of the device including the metallization thereof in cross-hatch;

FIGS. 5 and 5A are views similar to FIGS. 4 and 4A, of a third embodiment of the invention;

FIGS. 6 and 6A are views similar to FIGS. 4 and 4A, of a fourth embodiment of the invention;

Figure 3:
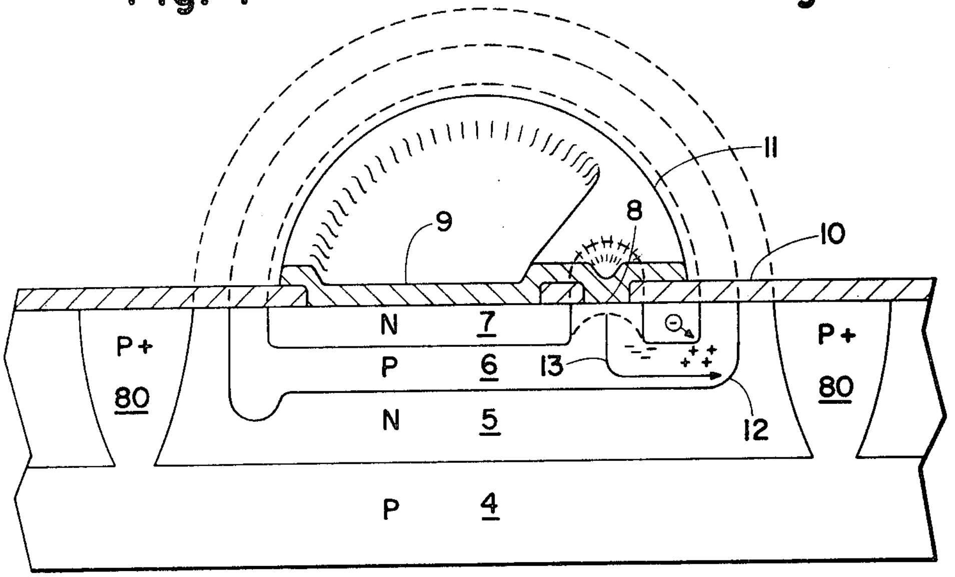
FIG. 3 is a perspective view of one embodiment of the invention, sliced down its middle to show it internally in section, FIGS. 3A, 3B, 3C and 3D showing plan views of diffusion masks for the second base of the device, and FIG. 3E showing a cross-section of the base region after diffusion using the masks of FIGS. 3C and 3D.
Figure 8:
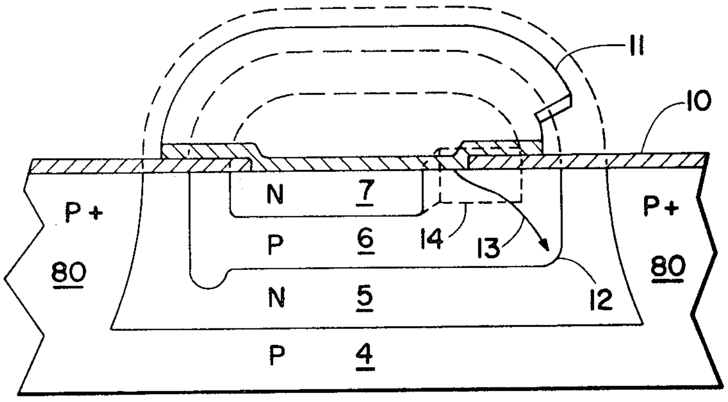
Figure 8A:
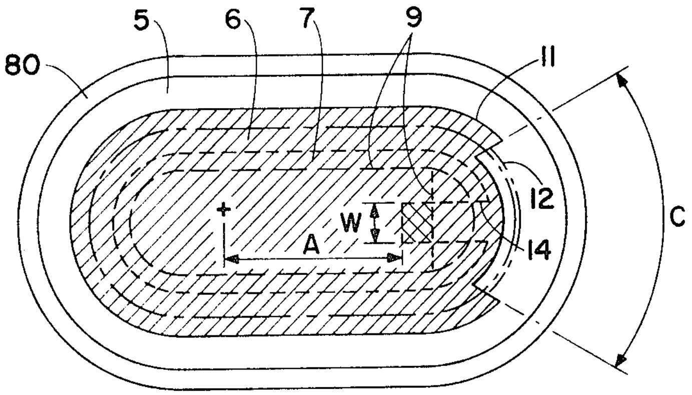
Figure 9:
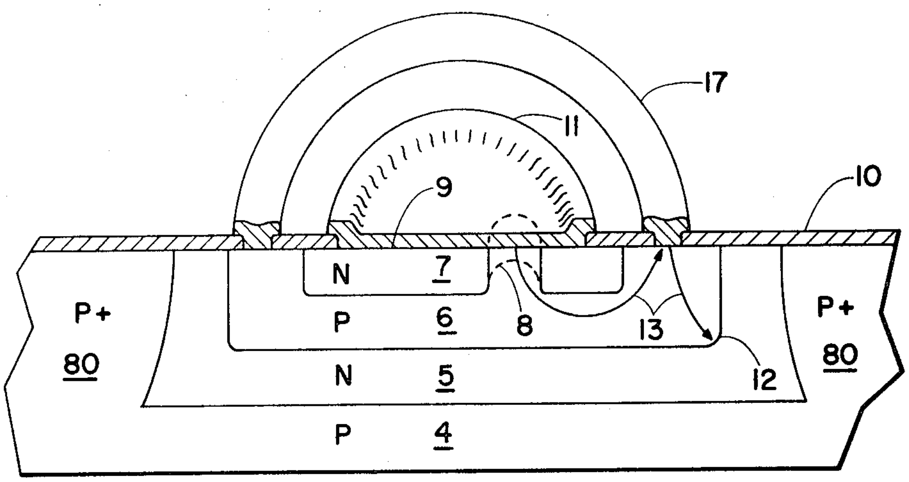
Figure 10:
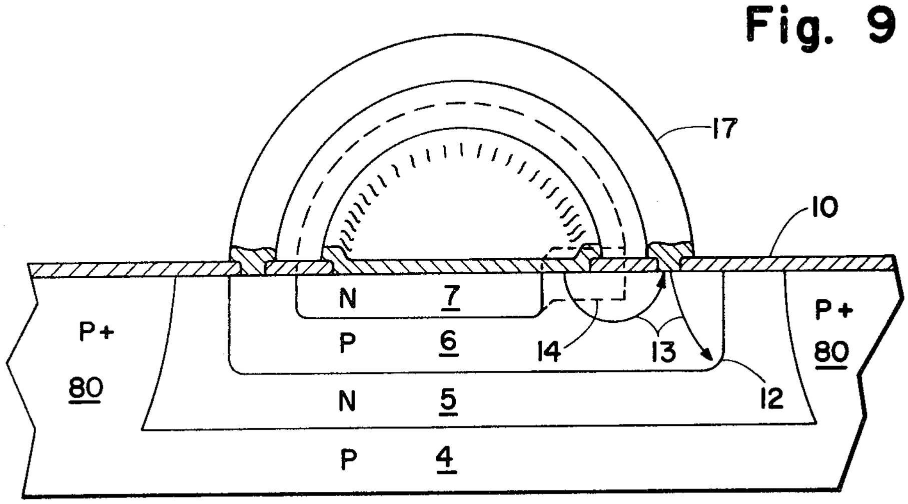
Figure 11:
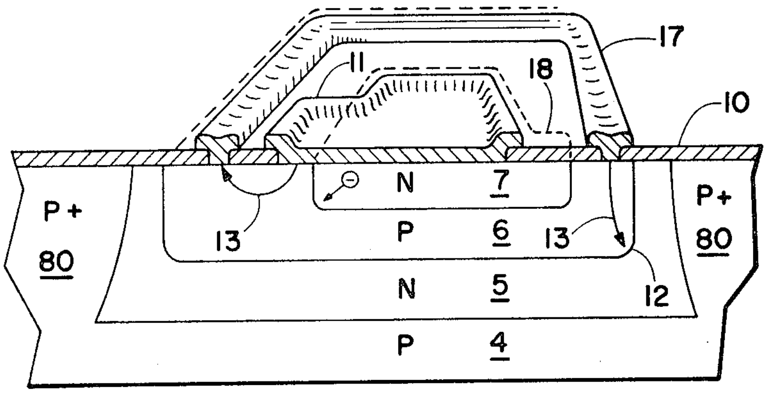

FIGS. 8 and 8A views similar to FIG. 4 and 4A, of the preferred embodiment of the invention;

FIG. 9 is a view similar to FIG. 3, of a modification to the embodiment shown in FIG. 3;

FIG. 10 is a view similar to FIG. 5, of a modification to the embodiment shown in FIG. 5; and FIG. 11 is a view similar to FIG. 3, of a seventh embodiment of the invention.

Figure 1:
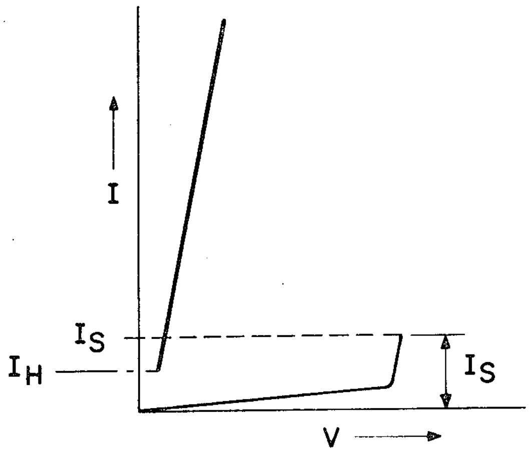
FIG. 1 is a graph of the transfer characteristics of a semiconductor switch of the character described herein.

FIG. 1 is a graph showing the transfer characteristics of a four-layer two-terminal semiconductor switch. As the voltage applied across the device increases, as shown along the ordinate V, the current, as shown along the abscissa I, increases very little until a critical switching voltage is reached. At this voltage the current through the device increases rapidly to a value $I_S$, the switching current. This point is marked by a sudden decrease in impedance of the device, accompanied by a sudden decrease in voltage detectable thereacross. If the applied voltage is increased by applying a further bias, or by applying a signal, or both, the current passed through the device increases dramatically at low voltage levels.

If the voltage (and current) through the device is then decreased, a critical minimum value $I_H$, the holding current, is reached, below which the impedance suddenly increases and the current which may pass through the device is decreased dramatically. Preferably, the holding current is less than the switching current in order that residual power supply requirements may be minimized, but this is not absolutely necessary.

The behaviour of any four layer switch is best understood by regarding it as being substantially an NPN and a PNP transistor, placed back to back and having the center two layers in common. Hence, the collector of one transistor is the base of the other and vice-versa. It follows therefore that the collector current of one device feeds the base of the other and vice-versa. It is the latter aspect which accounts for the switching action of the device.

At forward bias voltages substantially below the breakdown voltage of the center junction, the current through the device is substantially the leakage current of this junction. The device is normally designed so that the sum of the common base current gains of the two transistors is less than unity for low current levels. Under these circumstances there will be no net current gain through the device. If, however, the current gain of either or both transistors should increase such that the sum of the current gains are equal to, or greater than, unity, then a positive feedback effect will set in since each device will supply more than enough base drive for the other to maintain the overall current flow, and the current will therefore increase rapidly, limited only by the external circuitry.

In most four layer switches the gains of the two devices are substantially different due to differences in base width, due to the method of construction and to differences in emitter efficiency. The switching of such devices is generally achieved by manipulating the gain of the higher gain transistor. There are essentially two different methods of achieving this. By introducing a third terminal, i.e. making external connection to the base of the higher gain transistor, the forward bias on its emitter is controlled and thereby the emission current level is altered. Since, at low current levels, gain is normally a fairly strong positive function of current level, it is thereby possible to adjust the current level such that the overall gain exceeds unity and the device switches on.

With both bases open circuit, that is, with no external third terminal, the device can be made to turn on by increasing the forward bias voltage until the current level increases to the point at which the necessary gain conditions are achieved. The increase in current may be due either to increasing leakage at higher voltages or to the onset of breakdown of the reverse biased junction. Generally speaking it is very difficult to manufacture a device to operate in this mode in which the current level at which switching occurs, or the voltage at which this current level is achieved, is accurately controlled. The shorted emitter four layer switch, of which class the present invention is an example, was devised in order to get around some of these difficulties.

In this type of device one emitter-base junction is short circuited by making a common electrode connection to the emitter and base of one of the transistor structures. At low current levels the base may be considered to be at uniform potential and hence the whole of the emitter junction will be at zero bias and will not inject. However, if the current level is increased then the transverse flow of current through the base will cause a voltage drop through its internal resistance which increases with increasing distance from the base portion of the electrode and is of the correct sign to make portions of the emitter, remote from the base contact, forward biased. When the transverse base currents are sufficiently great to bias on any part of the emitter to such a level that the overall unity gain conditions are achieved, then the device will switch on. The current distribution in the device in the "on" condition is such that a forward emitter bias on the short circuited emitter is maintained everywhere except for a small region close to the shorting contact. Hence the major part of the emitter will be actively emitting.

In the "on" condition, each transistor is receiving a much higher base current than is required to maintain the overall current level and hence is operating in what is generally called the "saturation mode". In this mode, both emitter junctions are in a forward bias condition. Hence all three junctions are forward biased in the "on" condition and since the voltage drops of the two emitter junctions are in opposite directions and of approximately the same magnitude, they tend to cancel. Thus the overall voltage drop is comparable with a single forward biased junction plus any series resistance in the bulk material and contacts. Since the voltage drop across the device is so much lower in the "on" condition than in the "off" condition, it is essential that the current be limited by external circuitry in order to prevent rapid destruction of the device.

The device will remain on as long as the current level is maintained such that transverse current in the base can generate enough voltage drop through to its resistance to maintain some part of the emitter in the "on" condition. It follows that as the current level is decreased a smaller and smaller area of the emitter remains on, until only a small portion remote from the base contact continues to emit. Any reduction in current level below this value will cause the device to revert to the high impedance "off" condition, this minimum current level being the "holding current $I_H$".

Figure 2:
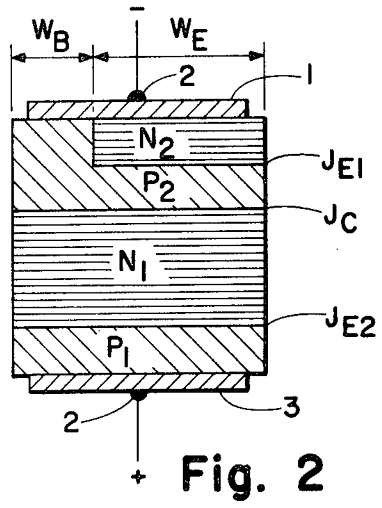
FIG. 2 is a cross-section of a four layer semiconductor switch according to the aforementioned Aldrich and Holonyak, Jr. article, similar in many respects to the aforementioned Tefft and Stehney patents.

Turning now to FIG. 2, a cross-sectional view of a typical two-terminal four-layer device is shown, such as the one described by Aldrich and Holonyak Jr. in the aforementioned article, comprising four contiguous regions $P_1$, $N_1$, $P_2$, and $N_2$, joined at junctions $J_{E1}$, $J_C$ and $J_{E2}$ as shown. Emitter and base regions $N_2$ and $P_2$ are short-circuited by metallization layer 1. Each of a pair of external terminals 2 are connected respectively to the metallization layers 1 and 3, the latter ohmically contacting region $P_1$.

With external voltage applied across terminals 2 with opposite polarity to that shown in FIG. 2, junctions $J_{E1}$ and $J_{E2}$ are reversed biased. While junction $J_{E1}$ is short-circuited, the device exhibits high impedance due to reverse biasing of junction $J_{E2}$; a small current flow being due to leakage current across junction $J_{E2}$. At a sufficiently high voltage, avalanche conduction occurs through the junction.

With an external voltage applied according to the polarity shown, junction $J_{E2}$ is forward biased. Junction $JE_1$ is short-circuited by metallization layer 1, and junction $J_C$ is reverse biased. Consequently, the small current traversing junction $J_C$ will be the leakage current conducted from the metallization layer 1 through region $P_2$ across junction $J_C$ and across forward biased junction $J_{E2}$ to the metallization layer 3 and the positive terminal of the device. The leakage current will be the small amount of current shown in FIG. 1 at levels below the switching current.

As the current is increased, the transverse current flowing in base region $P_2$ will cause the emitter $N_2$ to become forward biased at a place remote from the base contact, and begin emission, switching the device to its "on" condition. As the current is further increased, more and more of the emitter will begin to emit, as described earlier.

In the mesa-type devices of Aldrich and Holonyak Jr., the switching current, $I_S$, at which the device turns on, is controlled by controlling the proportion of the total base junction area which lies under the emitter to that which lies outside the emitter area. This is easily understood if the simple case of uniform current distribution across the reverse bias junction is considered, (which is nearly exact in a perfectly fabricated device.). That portion of the current feeding the reverse biased junction, which flows under the emitter, will contribute to the biasing "on" of the emitter, whereas the portion of the current which flows to the junction not under the emitter, will not contribute to the biasing of the emitter. Since the emitter will turn on at some finite current value flowing laterally under the emitter, then the total value of $I_S$ will increase with increasing junction area providing non-contributory current.

In these devices the value of the holding current $I_H$ will depend upon the value of the lateral spreading resistance under the emitter between the short-circuited portion of the emitter junction and the most remote portion of the emitter junction, and hence, will depend upon the general emitter width. Since this same resistance is that which generates the voltage drop necessary to turn the device on, it is obvious that $I_S$ and $I_H$ are difficult to control independently of one another.

Furthermore, in mesa junctions, the breakdown voltages of the plane region of the emitter junction and of the edge of the junction where it intersects the bare semi-conductor surface are likely to be very approximately equal. However, variations in the surface conditions and minor structural defects within the bulk are likely to make any portion of the junction have somewhat different characteristics in an unpredictable and frequently time variable manner.

Similarly, the distribution of leakage current density over the emitter junction, particularly at the surface, is likely to be unpredictable and variable. Consequently, the distribution of reverse current on the reverse biased junction, whether in leakage or avalanche breakdown mode, is likely to be unpredictable and difficult to control and hence $I_S$ is likely to be difficult to maintain under control.

It is a feature of this invention that the current conduction paths through the base are placed under the device designer's control, whereby both the switching current $I_S$ and the holding current $I_H$ may be set virtually independent of each other.

It has been found that a number of advantages are obtained through use of a planar structure of the four layer switch; that is, a structure in which certain ones or all of the junctions end at one surface of the device chip according to the technology described in U.S. Pat. No. 3,260,902 to E.H. Porter. These types of junctions can be made with very low reverse biased leakage currents up to very close to the breakdown voltage. Since such reverse biased junctions are substantially curved as they approach the chip surface, the breakdown voltage of the edge of the junctions about the curved portions is substantially below that of the plane portions of the junctions. As a result, substantial avalanche breakdown currents may flow without the plane portion of the reverse biased junction going into avalanche breakdown at all.

It has been found that a symmetrical structure of a four layer switch utilizing the technology described in the Porter patent noted above provides a switch in which $I_S$ is reached with the junction in avalanche breakdown at the edge, and at such a level that the reverse leakage of the junction is negligible in comparison. The path taken by $I_S$ is clearly defined as the path through the base between the base contact and the junction periphery. The resistance value of this path may be adjusted by constricting beneath one or more circular diffused emitters completely encircling the base contact in a symmetrical manner. This results in an improved device over the earlier described Aldrich et al mesa structure from the point of view of constancy and controllability of both $I_S$ and $I_H$. However, since $I_S$ and $I_H$ take substantially the same path from the central base contact to the outer edge of the emitter, they remain closely interdependent.

A further problem, which appears to be associated with the symmetry of these devices, is that the device tends to turn on first in a filamentary mode in which only a small portion of the device turns on and later switches to a full-on mode with a resulting discontinuity in the forward current transfer characteristic. The level at which this discontinuity occurs also appears to be a function of the annular emitter geometry and the base sheet resistance, making it very difficult to design a device having simultaneously a useful working current range free of discontinuities with acceptable values of both $I_S$ and $I_H$.

In this invention, the place on the emitter at which emission into the base begins to occur is under control. Conduction current is spread under physically controlled conditions to other portions of the emitter at higher current levels than the localized emission level. This results in a smooth spreading of emitter emission about the emitter at increased current levels. Substantially no discontinuities in the transfer characteristic in the turned on condition are observable.

In order to separate $I_S$ from $I_H$, a separate current path having an unique path resistance is provided for the switching current $I_S$. One embodiment of the invention utilizes an asymmetrical annular emitter to define the current path through the base. Another utilizes a conduction path through a narrow keyway or gap in the emitter. Both embodiments result in different path resistances for the switching current $I_S$ than for the holding current $I_H$.

Control of the direction of the current path to the reverse-biased base junction in one form of the invention is provided by a region of lower breakdown voltage at the position of desired avalanche conduction than other places on the junction.

Another embodiment involves the use of an annular highly conductive ring disposed over the base area surrounding the emitter, providing an equipotential ring. With homogenous base sheet resistivity, the closer the base contact within the emitter aperture is to the equipotential ring, the lower the switching current path resistance is, aiding the preferential flow of switching current through the short path. Since the dimensions and positions of all parts of the device can be predetermined, excellent control is achieved of the switching current and spreading thereof during the conduction mode.

A fourth embodiment involves the use of metalization over but not contacting the first base-second base junction, except at the place where current is desired to flow preferentially. The metallization will inhibit the onset of junction avalanche as described in U.S. Pat. No. 3,405,329 to A. Loro et al, issued Oct. 8, 1968. The metallization cutout does not inhibit junction avalanche therebelow, resulting in a preferred current conduction path through the base to its periphery.

It will be noted that the aforementioned embodiments all involve enhancing the flow of starting current through a defined low resistance path in the base. Since a larger switching current therefore is necessary through the low resistance path to obtain the critical emitter bias required for onset of emission, a larger switching current is accordingly required to cause the device to switch. The larger switching current was described earlier as being desirable in order to increase rate firing immunity.

One useful embodiment of this invention is shown in FIG. 3, a perspective view of a PNPN switching device cleaved through a diameter so as to show a sectional view through its interior. Sectional lines have been deleted from the semiconductive section of the device in order to distinguish the layers more clearly.

The device is comprised of a P type conductivity first emitter 4 contiguous with N type conductivity first base 5, which is further contiguous with P type conductivity second base 6, which in turn is further contiguous with N type conductivity semiconductor second emitter 7. Preferably the first emitter 4 is comprised of a P doped silicon substrate, while the first base 5 is comprised of an N doped epitaxial layer into which the second base 6 and second emitter 7 are diffused.

Base 5 is diffused into emitter 4 from one surface of the semiconductor, and an annular isolation ring 80 of highly doped P+ material is deep diffused through the epitaxial layer into contact with the first emitter 4 substrate from the surface.

It should be noted that the base junction in this invention which corresponds to junction $J_C$ in FIG. 2 is reverse biased in its high impedance condition with the application of external forward bias. In order to conduct the switching current, the base junction first operates by avalanche breakdown. The structure defined causes the avalanche conduction through the base junction, at a defined and preselected breakdown point or region 12 thereof.

In this embodiment it is preferred that the second base 6 have two different impurity concentration gradients at its periphery. The portion of the periphery through which the avalanche current flow will be enhanced at the onset of breakdown should have a higher gradient than the remainder of the periphery of the base region. Since a higher gradient will result in a higher electric field and hence cause current multiplication and avalanche breakdown at a lower bias voltage, current flow will be enhanced at the higher gradient, which electrically appears to be a sharp edge to the base 6.

Figure 3A:
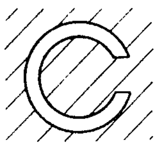
Figure 3B:
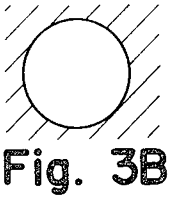

This structure can be achieved by forming the second base 6 in two steps. The first step is to diffuse the base impurity through a mask such as shown in FIG. 3A in which the blank area constitutes the mask cutout. Accordingly, a "C" shaped area of the base will be doped with a P type impurity such as gallium, aluminum, boron, or indium. Once this doping is complete a shallow second doping step with a similar impurity type is conducted through a mask such as is shown in FIG. 3B, which will increase the impurity concentration gradient of the already doped C shaped areas, while providing P type doping to the remainder of the area within the mask. As is well known, the second diffusion stage will drive the C shaped doped areas deeper into the first base 5. This will provide a smaller radius of curvature of the base 6 periphery and steeper doping profile at the position of the gap in the C shaped masked region along the outside periphery of the shallower second-diffused base region. This is the position at which avalanche breakdown will begin.

Figure 3C:
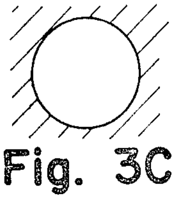
Figure 3D:
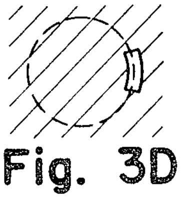
Figure 3E:
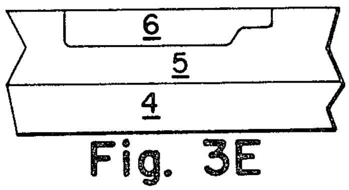

Alternatively, the first P type diffusion could have been made through a mask such as shown in FIG. 3C, to provide a disk-shaped diffused base region. A second P type diffusion then is made through a smaller mask positioned as shown in FIG. 3D to a shallower depth, resulting in a base cross-section 6 shown in FIG. 3E. The shallower the junction diffusion, the smaller the radius of curvature of its edge, and the greater the electric field tending to localize initial avalanche breakdown.

An N doped second emitter 7 is then diffused into the second base 6 using a well-known N type impurity, such as antimony, arsenic or phosphous. The emitter is asymmetrically annular in shape, with the aperture of the annulus close to one edge of the device. The shortest line extending from the centre of the aperture to the periphery of the emitter 7 lies directly above the conduction path which is expected to be the lowest resistance path for the breakdown current to flow through the base 6.

In a well-known manner, the surface of the semiconductor is covered with a layer of insulating material such as silicon dioxide, which may be used as a mask for ohmic metallized contacts. Holes in the insulating layer should be left for ohmic contacts above the aperture 8 and also above the bulk portion of the second emitter 7.

A metallization layer 11 is deposited by well-known techniques over the surface of the device, ohmically contacting the second base 6 at the surface of the aperture 8, and the second emitter 7 at the contact area 9. The metallization layer 11 extends over the insulative layer 10 so as to short circuit between aperture 8 and emitter 7.

Since the main area of the emitter 7 is metalized, it will be seen that a low emitter impedance is obtained.

It is preferred that the emitter width between the base contact to aperture 8 and the preferred breakdown region 12 be kept as narrow as possible in order that the resistance path thereunder in the base 6 below. Thus, a relatively large amount of current is required before an appreciable voltage drop is obtained across the emitter between the annulus aperture 8 and the base 6.

Since the switching current $I_S$ flows from the aperture 8 at the semiconductor surface under the emitter to the base periphery at predetermined breakdown point 12, the breakdown switching current $I_S$ will be controlled by the emitter thickness above the path of current flow, and the sheet resistivity of the active base in this area. A thin emitter will provide a low resistance path in the base, this causing the switching current $I_S$ to be desirably high.

Once the device turns on, the emitter current flows from the contact area 9 to a region of emission adjacent the breakdown point 12 (actually a zone) through part of the emitter external to the metallized portion of contact area 9. The resulting voltage drop in the emitter reduces the forward bias on the emitter in this region relative to other parts of the emitter and promotes rapid spreading of the current to the rest of the emitter. In order to promote the internal biasing, a relatively high value of emitter sheet resistivity, such as about 10 ohms per square, should be used. The main area of the remainder of the emitter is metallized to provide a low emitter impedance.

As the current supplied to the device is reduced, it will remain switched on as long as any part of the emitter 7 is sufficiently forward biased to maintain an overall gain greater than unity. This bias is sustained by transverse flow of some of the PNP collector (second base 6) current flowing to the base contact at aperture 8. Low holding current $I_H$ is promoted by high base 6 resistance between the base contact at aperture 8 and the most remote region of the emitter 7. This can be achieved by making the emitter wide at this point, and selecting a suitable value of active base sheet resistivity.

It should be noted that aside from the special requirements of the base 7 periphery at the breakdown point (or zone), any region of the base 7 may be made either deep or shallow by choice. This permits the use of two values of base sheet resistivity and base width. Use of high active base sheet resistivity in the region between the base contact to the aperture 8 and the most remote part of the emitter results in low values of $I_H$. Low active base sheet resistivity between the base contact to the aperture 8 and the breakdown point 12 results in high values of $I_S$.

Turning now to FIG. 4 a semiconductor PNPN switch is shown which is similar to the one shown in FIG. 3, but with a different configuration of second emitter 7. In FIG. 4 a keyway communicates between the aperture 8 and the base region 6 outside the periphery of the emitter region 7 along the aforementioned channel.

Since in fabrication the second emitter 7 is diffused through a mask of the appropriate shape, it will be seen that the keyway is filled with material of second base 6. The base 6 is of similar configuration to the embodiment of FIG. 3.

In this structure it may be seen that there is even less resistance between the base contact at the surface of the aperture 8 and the breakdown point 12 than in the embodiment shown in FIG. 3, since the hole current need not flow under the emitter through a relatively narrow base region prior to switching. Accordingly, the switching current $I_S$ can be a higher value than that obtained using the embodiment in FIG. 3.

In the structure described with reference to FIG. 4, preswitching current flows in the direction shown by arrow 13 from the contact to the base annulus aperture 8 through the keyway toward breakdown point 12. As the current is increased a voltage drop within the base 6 adjacent the emitter 7 inside and under the keyway will forward bias that portion of the emitter next to the most positively charged part of the base, to be found along the line of current flow closest to breakdown point 12. Once a critical level of preswitching current passes along the keyway through the material of the second base 6, emission of electrons from the emitter 7 into the base 6 begins and a sudden decrease in impedance of the device is observed, the critical level of current being the switching current $I_S$. At higher current levels the current within the device spreads as described with reference to the structure of FIG. 3, and the holding current $I_H$ is also established by the mechanism described.

FIG. 4A shows a plan view of the device of FIG. 4, with the metallization layer crosshatched. The keyway in the emitter 7 may be clearly seen.

Turning now to FIG. 5, a structure is shown which is similar in all respects to FIG. 4 except that the keyway has been widened to the same diameter as the aperture 8. The emitter structure may alternatively be thought of as containing a slot 14 extending from one edge thereof.

An insulative layer 10 similar to the one described earlier covers the entire surface of the device except for an area inwardly of the edge of the second emitter 7 at the surface, crossing over the aforementioned slot 14. In other words, the portion of the slot which would have formed approximately the aperture 8, that is, the portion of the slot most inward of the edge of emitter 7, is left uncovered by the insulative layer 10.

A metallization layer 11 covers and is ohmically and adherently attached to the surface of the device left uncovered by the insulative layer 10; that is, to the inward uncovered surface of the second emitter 7 and the uncovered portion of the second base 6 extending to the surface of the device through slot 14. This provides a short circuit between the base 6 and the emitter 7 as described earlier.

In operation, the structure described with reference to FIG. 5 is similar to that described with reference to FIG. 4. However since slot 14 is considerably wider than the keyway of FIG. 4, the resistance between the base contact and the breakdown point 12 is even less than in the structure of FIG. 4. Consequently, a desirably higher starting current will be obtained by use of the structure of FIG. 5.

FIG. 5A shows a plan view of the structure of FIG. 5, with the metallization layer crosshatched.

FIG. 6 shows a further variation of the embodiment of FIG. 5. In this structure, the second emitter 7 is comprised of a bifurcated protrusion, or a pair of protrusions 15 immediately next to the slot 14 extending past the metallization layer 11 into the second base region 6.

In operation, pre-starting current along arrow 13 flows from the base contact above the slot 14 past protrusions 15 to breakdown point 12. As described earlier, this will cause emission from the second emitter 7 when the base region 6 adjacent the protrusions 15 has provided sufficient bias across the emitter 7 that electrons will begin to be emitted from emitter 7 into base 6, switching the device into its low impedance mode. The device then generally operates as described earlier.

FIG. 6A shows a plan view of the structure of FIG. 6, with the metallization layer crosshatched, and the contact area doubly crosshatched.

Figures 7, 7A:
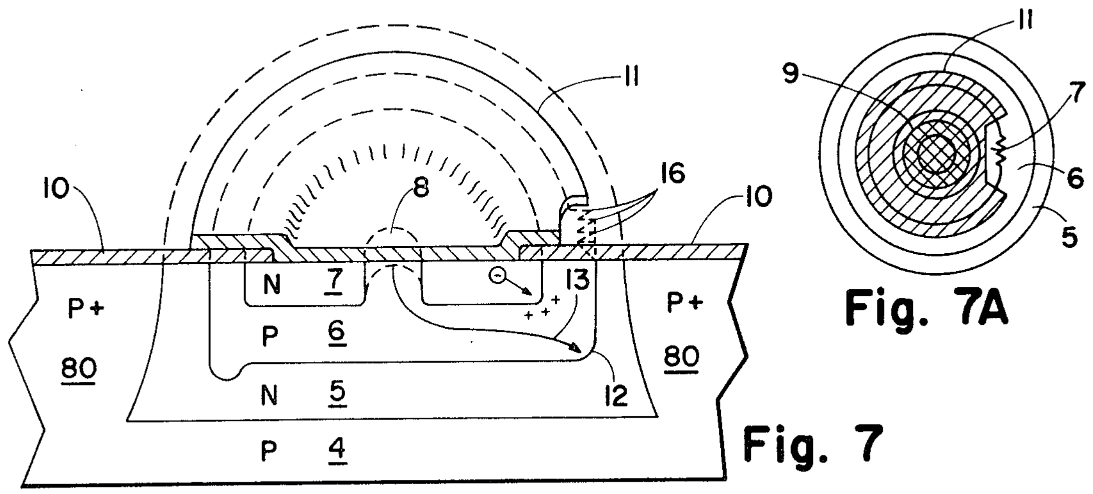
FIGS. 7 and 7A are views similar to FIGS. 4 and 4A, of a fifth embodiment of the invention.

Turning now to FIG. 7, a PNPN switching device as shown which is similar to the devices described above except, firstly, that the second emitter 7 may be of symmetrical annular shape. Under ordinary circumstances this would cause different portions of the emitter to begin filamentary emission at different current levels during its low impedance mode, giving rise to the conduction discontinuity disadvantages described earlier in this specification.

However, second base region 6 is formed with a single or a multiplicity of serrations 16 lying transverse to the surface of the device, extending into the first base region 5.

Since the current will flow preferentially from a sharp-radius edge, it will be seen that current will first begin to flow from base 6 to base 5 through the serrations.

An insulative layer 10 covers the entire surface of the device except for a disc shaped area over the second emitter 7 including the aperture 8, inwardly of the outer periphery of the second emitter 7.

A metallization layer 11 is disposed over the surface of the device uncovered by the insulative layer 10, ohmically contacting both the second emitter 7 and the portion of the second base 6 extending through the aperture 8.

The metallization layer 11 is also preferentially extended over the insulative layer 10 to a periphery between the second base-first base junction and first base-first emitter junction. A portion of the metallization layer 11 lying over the serrations 16 of the second base 6 is deleted, to a line outward of the emitter 7 — base 6 junction, as shown in FIG. 7.

In operation, it will be seen that current flow between bases 6 and 5 will preferentially occur at the extremities of the short-radius serrations 16 of the second base 6, which forms the breakdown point or region 12. As current is conducted through the device, it will flow from the metallization contact 11 at the aperture 8 through second base 6 to breakdown point 12 via the path shown by arrow 13. Due to the serrations, the current is concentrated along a preferred path. As it passes under a designated surface of the second emitter 7, as described earlier a bias voltage will be set up in the second base 6, as earlier described. When the bias is large enough, emission of electrons into the base will begin, switching the device to its low impedance state. Current at higher levels will then spread to other areas of the emitter, as well as to other parts of the first base-second base-junction generally as described earlier.

FIG. 7A shows a plan view of the structure of FIG. 7, with the metallization layer crosshatched, and the contact area doubly crosshatched. The function of the extended metalliztion layer will be described with reference to the embodiment shown in FIG. 8.

In those embodiments described herein, the emitter 7 has been described as generally annular in shape, either symmetrical or unsymmetrical. While the term "annular" is often used to describe a structure having a generally circular outer periphery, it is intended that in the context of this specification it means a flat configuration diffused into a base region with a hole or aperture through a portion of it. Certain of the embodiments have channels, keyways, and the like connecting the aperture to the periphery of the emitter, in some cases the channel having a width equal to the diameter of the aperture.

The annular structure is therefore intended to include variations of circular outer periphery, including shapes of oblong character, rectangular, and others often used in diffused structures of active type.

It will also be recognized that all the figures shown herein have been distorted in a vertical direction in order to more clearly illustrate the invention. However, the diffusion depths are normally only a small fraction of a mil, while the lateral dimensions are of the order of from fractions to a few mils.

FIG. 8 shows the preferred embodiment of this invention. This structure is very similar to the one shown in FIG. 5 except that the metallization layer 11 extends to a periphery over the insulative layer 10 to a position between the second base-first base junction and the first base-first emitter junction. The periphery is extended similarly as far as that of the metallization layer described with reference to FIG. 7, and preferably extends outwardly about 1 mil beyond the edge of the reverse-biased base junctions. When using this metallization layer, the silicon dioxide insulative layer thereunder should be approximately 1,000 to 2,000 angstroms thick.

A portion of the metallization layer is deleted over an area extending from its periphery, having sides subtending a predetermined angle from the annulus aperture ending between the outer edge of emitter 7 and the second base-first base junction. The area deleted should be positioned so as to extend equally on either side of the axis of slot 14.

The function of the metallization layer 11 in this structure is to inhibit current flow across most of the second base 6-first base 5 junction. The deleted portion of the metallization 11 which is immediately above the breakdown point 12 will tend to relieve the aforementioned inhibition of current flowing to the second base-first base junction under said deleted portion of the metallization layer 11, further encouraging current flow to the adjacent portion of the base periphery.

The metallization acts similar to the guard shield described in U.S. Pat. No. 3,405,329 to A. Loro.

Pre-switching current will flow from the base contact at the surface of the device above the slot 14 in a similar manner to that described earlier, as will the onset of electron emission from the emitter, and the switching off of the device.

It is also preferred that the double diffused base 6 be made using the masks of FIGS. 3C and 3D which provide a sectional profile of the base as shown in FIG. 3D, since better control of base resistivity, diffusion profile, etc, are obtained.

FIG. 8A is a plan view of the embodiment shown in FIG. 8 in which the edges of all metallization areas, junctions, etc, are clearly identified. The device is preferably made with the second base 6 and second emitter 7 diffused into an N type epitaxial layer on a P type substrate as described earlier. The device preferably is also surrounded by a P+ doped isolation ring 80 diffused through the epitaxial layer to the substrate. Inwardly of the isolation ring the first base 5 will appear at the surface under the insulative layer, not shown.

Inwardly of the first base, is the second base 6, doped P type, and inwardly of the second base is second emitter 7, doped N type, having a slot 14 cleaving one side transversely to the surface.

The insulative layer is deleted within the contact area 9, whereby metallization may ohmically contact the surface of the second base 6 within the slot 14 as distinguished by the tightly crosshatched area shown having width W.

A metallization layer 11 is laid adherently over the surface of the semiconductor and the insulative layer 10, making ohmic contact with the surface of the second emitter 7 within the contact area 9.

The metallization layer 11 extends over the second base-first base junction in this preferred embodiment, except for a deleted portion lying on either side of the axis of slot 14, over the breakdown point (region) 12 of the base 6. The deleted portion can be described as subtending angle C having axis in the base contact area mentioned above. It is mainly essential, however, simply to delete a portion of the metallization layer over desired breakdown point 12 along the base 6 periphery.

The breakdown point 12 will be somewhere along the edge of the first base 5 — second base 6 junction below the deleted section of metallization layer 11 identified by reference numeral 12 and the double dashed line.

It has been found that variation of the width W of the base contact area controls the starting current $I_S$, while the distance between that contact and the centre of the second emitter contact defined by distance A controls the holding current $I_H$.

It was also found that with an active base resistivity of 6.5 thousand ohms per square, with base contact widths W varying over the range of up to 1.5 mils, while retaining a base contact, $I_S$ varied from about 0.5 to 4.0 milliamperes (a current ratio of one-eighth), whereas $I_H$ varied only from approximately 3.4 to 5.0 milliamperes, (a ratio of 1/1.5).

With distance A varying over the range from 4.0 to about 0 mils $I_H$ varied from 2.75 to 4.2 milliamperes, a ratio of 1/1.5, whereas $I_S$ varied only from 1.2 to 1.5, a ratio of 1/1.25.

It is clear that at least to a first order, the starting current and holding current has been demonstrated as being controllable, independently to a large degree.

The capacitance of the device just described was found to be 3.8 picofarads.

The device has isolation ring boundary radii of 4.5 to 5 mils, a metallization layer radius of 3.5 mils, a second base radius of 2.0 mils and second emitter radius of 2.5 mils, and a contact window radius of 2.0 mils. Angle C was 90°.

Smaller devices having dimension W of 0.5 mils, and dimension A varying from about 0 to 2.0 mils provided parameters of $I_S$ of 1.4 to 2.2 milliamperes, $I_H$ of 2.5 to 5.5 milliamperes and a capacitance of 1.8 picofarads. The external switching voltage was 33 volts.

The small devices fabricated above had an isolation ring radius of 2.75 to 3.25 mils, and a metallization radius of 2.25 mils. The cutout within angle C shown in FIG. 8A was 90°. The second base had a radius of 1.75 mils while the emitter radius was 1.5 mils. The metallization contact window had a radius of 1.25 mils.

The larger dimensioned device was made with a double diffused second base region as described with reference to FIG. 3 and the masks of FIGS. 3C and 3D in order to obtain a more abruptly graded junction in the area of the second base periphery where breakdown is desired. In an experiment with 28 devices, 14 having double diffused second bases, and fourteen without, the average switching current $I_S$ using the double diffused second base was 2.2 milliamperes while the average of those device without was 1.2 milliamperes. The holding current varied between 2.9 and 3.0 milliamperes in average.

Clearly the provision of a double diffused second base increases the switching current $I_S$, helping, which it is believed increases the rate firing immunity of the device, while the holding current is little affected.

Turning now to FIGS. 9 and 10, structures are shown here which are similar to those of FIGS. 3 and 5. The metallization layer does not extend over the second base-second emitter junction, but extends only to a boundary inwardly of the second emitter 7 periphery. A metallization band 17 extending to the surface of the second base 6 is disposed completely around the emitter 7. This metallization band forms a highly conductive shunt, rendering the base area therebelow of equipotential. With a homogeneous base sheet resistivity, the closer the base contact within the annulus aperture is to the equipotential band edge of the base, the lower the effective resistance appearing along a path between the base contact and any part of the junction periphery. Since current will flow along that path preferentially, good control of the starting current results.

It should be noted that use of this equipotential ring eliminates the necessity for selecting a particular portion of the base 6 periphery to breakdown preferentially. Accordingly, a single diffused base is only required, in the well known planar form, which saves processing steps.

In operation, current from the base contact will flow along a preferred low resistance path to the equipotential ring, then along the ring with negligible voltage drop to a position close to an unselected breakdown point along the base periphery. Since the current flowing past the emitter to the equipotential ring is also a controlled low resistance path, the required voltage drop within the base next to the emitter, to provide $I_S$ emission bias to the emitter, is obtained.

It should also be recognized that it is not necessary that the band 17 actually be of metallization. The band can be made conductive by diffusing a shallow highly doped ring into the base in its stand. With the polarity shown, the ring should be doped P+ type into the P type base 6. In general, the ring should be formed by heavier doping with a dopant from the same group of the periodic table as the dopant used to diffuse the base 6.

Turning now to FIG. 11, a further embodiment of this invention is shown. Contiguous regions 4, 5, 6, and 7 are similar to those described with reference to the earlier embodiments, except that second emitter region 7 is not annular in shape, but is simply a disc of generally circular or rectangular configuration, with a protrusion 18 extending outwardly of the disc area. Insulative layer 10 covers the entire surface of the device except for an area inwardly of the edge of the emitter 7, a tab-shaped area outwardly of the second emitter 7 on the side of the emitter opposite to that of protrusion 18 and a ring area entirely surrounding the emitter 7 above the base 6 region. The portion of the surface not covered by the insulative layer 10 inwardly of the ring area is covered by metallization layer 11, which does not extend over the periphery of the second emitter 7 except to extend over the aforementioned tab area.

As in earlier embodiments, a metallization band 17 extends in the ring area through the insulative layer 10 to the surface of the device completely surrounding the emitter 7. A single base 6 diffusion, as described with reference to the embodiments of figures 9 and 10, is only required.

Since the portion of the second base 6 under the metallization band 17 is of equipotential, applied current will flow equally well from the metallization layer 11 to those areas of the base under the band. However, it will be seen that a considerable amount of pre-starting current will flow to the periphery of the base 6 before sufficient current flows past the edge of second emitter 7 to bias part of that surface to the point at which emission will begin from the emitter 7.

It is to be understood that the above-described arrangements are illustrative of the application of the principles of the invention. Numerous other arrangements including combinations of the structures disclosed herein may be devised by those skilled in the art without departing from the spirit and scope of the invention.

What is claimed is:

1. A semiconductor device comprising:

a. a succession of four contiguous semiconductor regions, each successive region having opposite conductivity from the previous, said regions being defined by a first emitter region, a first base region contiguous with the emitter region, a second base region diffused into a defined volume of the first base region, and a second emitter region diffused into a defined volume of the second base region; the junctions between the first base, second base and second emitter regions extending to one surface of the semiconductor device, b. contact means connecting the second emitter region to the second base region, the improvement characterized by c. a resistive path from the contact means to a predetermined portion of the outer periphery of the second base region, said portion having a significantly lower breakdown voltage than any other portion of said periphery, said path passing directly through and via the second base region adjacent a portion of the second emitter region, and having a lower resistance than any other resistive path between the contact means and any other location on said outer periphery of the second base region.

2. A semiconductor device as defined in claim 1, in which the predesignated portion of said periphery has a steeper impurity concentration gradient than the remainder of said periphery.

3. A semiconductor device as defined in claim 1, in which the predesignated portion of said periphery has a shorter radius of curvature than the remainder of said periphery.

4. A semiconductor device as defined in claim 3, in which the second base region is approximately disc or ellipse shaped, comprising a border region having a reduced thickness and a shorter radius periphery in cross-section than the remainder of the second base region, the shorter radius periphery defining said predesignated portion.

5. A semiconductor device as defined in claim 3, in which the second base region is approximately disc or ellipse shaped, a C shaped portion thereof forming the major part of the outer periphery being deeper diffused than the remainder; the edge of the disc or ellipse shaped portion at the gap in the C defining said predesignated portion.

6. A semiconductor device as defined in claim 3, in which said predesignated portion is comprised of one or more sharply angled serrations lying transverse to said one surface of said device, extending into the first base region.

7. A semiconductor device as defined in claim 3, further comprising means for providing said preferred path of current flow through the second base region under and adjacent a portion of second emitter region.

8. A semiconductor device as defined in claim 7, in which the second emitter region contains a hole through which the second base region extends to said one surface of said device, the hole being disposed closer to the periphery of the second emitter region adjacent said predesignated portion of the second base region; the contact means comprising a metallization overlay within the boundary of the second emitter region contacting both the second emitter region and the second base region above the hole at said surface, the portion of the base region from the contact means through the hole to said predesignated portion of the second base region defining said preferred path of current flow.

9. A semiconductor device as defined in claim 3, further comprising means for providing said preferred path of current flow through the second base region bounded and limited by portions of the second emitter region on either side of said path.

10. A semiconductor device as defined in claim 9, in which the second emitter region contains a keyway extending transversely into the region a predetermined distance, and completely through the depth thereof, extending from the edge of the second emitter region adjacent said pre-designated portion of the second base region, the second base region extending through the keyway to said surface; the contact means comprising a metallization overlay within the boundary of the second emitter region contacting both the second emitter region, and the second base region above the keyway at the inner end thereof; the portion of the second base region from the contact means through the keyway to said predesignated portion of the second base region defining said preferred path of current flow.

11. A semiconductor device as defined in claim 7, further comprising a metallized area extending over the surface of said device to a boundary outwardly of the second base region and over the first base region, except for an area overlying the predesignated portion of the periphery of the second base region; and means insulating the metallized area from said surface outwardly of the contact means.

12. A semiconductor device as defined in claim 4 in which the second emitter region contains a keyway extending transversely into the region a predetermined distance, and completely through the depth thereof, extending from the edge of the second emitter region adjacent said predesignated portion of the second base region, the second base region extending through the keyway to said surface; the contact means comprising a metallization overlay within the boundary of the second emitter region contacting both the second emitter region, and the second base region above the keyway at the inner end thereof; the portion of the second base region from the contact means through the keyway to said predesignated portion of the second base region defining said preferred path of current flow; further comprising a metallized area extending over the surface of said device to a boundary outwardly of the second base region and over the first base region except for an area overlying the predesignated portion of the periphery of the second base region; and means insulating the metallized area from said surface outwardly of the contact means.

13. A semiconductor device as defined in claim 12, in which the first emitter region is comprised of a P doped silicon substrate, the first base region is comprised of an N doped silicon epitaxial layer contiguous with a surface at said substrate, the second base region is comprised of P doped silicon contained within a defined region of the epitaxial layer from said surface, and the second emitter region is comprised of N doped silicon contained within a defined region of the second base region from said surface, the insulative layer being comprised of silicon dioxide contiguous with said surface of said device; further comprising a P+ doped silicon isolation region spaced from and ringing the second base region, bounded by the epitaxial region on two sides thereof, in contact with the substrate.

14. A semiconductor device as defined in claim 12, in which the insulative layer under the metallized area has a thickness less than about 2,000 angstroms.

15. A semiconductor device as defined in claim 1 further comprising an electrically conductive ring completely surrounding the second emitter region at said surface centrally above the second base region, said preferred path being between the contact means and said ring.

16. A semiconductor device as defined in claim 15 further comprising means for providing said preferred path of current flow through the second base region under and adjacent a portion of second emitter region.

17. A semiconductor device as defined in claim 16, in which the second emitter region contains a hole through which the second base region extends to said one surface of the device, the hole being disposed closer to the periphery of the second emitter region adjacent said predesignated portion of the second base region; the contact means comprising a metallization overlay within the boundary of the second emitter region contacting both the second emitter region, and the second base region above the hole, at said surface.

18. A semiconductor device as defined in claim 15 further comprising means for providing said preferred path of current flow through the second base region bounded and limited by portions of the second emitter region on either side of said path.

19. A semiconductor device as defined in claim 18, in which the second emitter region contains a keyway extending transversely into the region a predetermined distance, and completely through the depth thereof, extending from the edge of the second emitter region adjacent said predesignated portion of the second base region, the second base region extending through the keyway to said surface; the contact means comprising a metallization overlay within the boundary of the second emitter region contacting both the second emitter region, and the second base region above the keyway at the inner end thereof.

20. A semiconductor device as defined in claim 15, in which the conductive ring is comprised of a ring-shaped metallization layer adherently disposed on the surface of said device.

21. A semiconductive device as defined in claim 15, in which the conductive ring is comprised of a highly doped ring of semiconductor, doped with an element from the same group of the periodic table as the dopant of the second base region, contained within the second base region at said surface.

22. A semiconductor device as defined in claim 9, further comprising a metallized area extending over the surface of said device to a boundary outwardly of the second base region and over the first base region, except for an area overlying the predesignated portion of the periphery of the second base region; and means insulating the metallized area from said surface outwardly of the contact means.

* * * * *